US006853181B1

(12) United States Patent
Ostertag

(10) Patent No.: US 6,853,181 B1
(45) Date of Patent: Feb. 8, 2005

(54) SILICON-ON-INSULATOR CHANNEL ARCHITECTURE FOR AUTOMATIC TEST EQUIPMENT

(75) Inventor: Edward Ostertag, Camarillo, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/749,266

(22) Filed: Dec. 31, 2003

(51) Int. Cl.[7] .............................................. G01R 31/32
(52) U.S. Cl. .................................... 324/158.1; 324/645
(58) Field of Search ............................. 324/158.1, 645, 324/523, 527, 528, 533, 750; 438/291, 289, 301, 151, 655

(56) References Cited

U.S. PATENT DOCUMENTS 6,567,031 B1 * 5/2003 Rezvani et al. ............. 341/161
6,660,598 B2 * 12/2003 Hanafi et al. ............... 438/291

* cited by examiner

Primary Examiner—David Zarneke
Assistant Examiner—Trung Q. Nguyen
(74) Attorney, Agent, or Firm—Teradyne Legal Department

(57) ABSTRACT

A channel architecture for use in automatic test equipment is disclosed. The channel architecture comprises pattern generation circuitry and timing circuitry responsive to the pattern generation circuitry to generate timing signals. Formatting circuitry coupled to the output of the timing circuitry generates pulse waveforms for application to pin electronics circuitry. The pin electronics circuitry is responsive to the formatting circuitry for interfacing the automatic test equipment to a device-under-test. The pattern generation circuitry, the timing circuitry, the formatting circuitry and the pin electronics circuitry are formed on the same integrated circuit.

8 Claims, 5 Drawing Sheets

SILICON-ON-INSULATOR CHANNEL ARCHITECTURE FOR AUTOMATIC TEST EQUIPMENT

FIELD

The invention relates generally to automatic test equipment, and more particularly a channel architecture formed with a silicon-on-insulator process for automatic test equipment applications.

BACKGROUND

Automatic test equipment provides semiconductor device manufacturers the ability to test each and every device fabricated. By testing each device, the manufacturer can sort devices having like speeds, and/or separate failed devices from passing devices. In this manner, the manufacturer is able to confidently put fully functioning devices into the marketplace.

FIG. 1 illustrates a typical semiconductor tester, generally designated 10. The tester includes a controller or computer workstation 12 coupled to a testhead 14. The testhead houses large circuit boards, or channel cards 16 that mount the electronics necessary for interfacing with one or more devices-under-test 18 (DUTs). In some instances, the controller may be integrated within the testhead, such that the entire tester comprises an integrated unit.

Modern testers generally have a "per-pin" architecture. A "pin" is circuitry within the tester that generates or measures one signal for the device under test. A "pin" is sometimes also called a "channel." In a per-pin architecture, each channel can be separately controlled to generate or measure a different signal. As a result, there are many channels inside one tester. The channels are generally controlled by a pattern generator. The main function of the pattern generator is to send commands to each channel to program it to generate or measure one test signal for each period of tester operation.

Testers typically generate waveforms for application to a device-under-test (DUT) with timing generation circuitry that responds to the commands or test patterns generated by the pattern generator. The output of the timing circuitry feeds a formatter circuit typically in the form of a flip-flop. The formatter responds to the timing signals to produce a pulse waveform having edge transitions corresponding to the timing information. The formatted waveform then feeds a pin electronics circuit that interfaces the tester to the DUT pin.

The pattern generation circuitry, the timing circuitry, and the formatter circuitry are typically digital circuits that operate at voltage levels appropriate for high-speed digital systems. CMOS processes are often used to fabricate integrated circuits employing the timing and pattern generation circuitry. CMOS is desirable due to its low-power and high-performance characteristics. In contrast, the pin electronics, and associated digital-to-analog converters (DACS) typically comprise analog circuits often requiring voltages higher than the breakdown voltages for individual CMOS transistors. Bipolar and SiGe processes are often employed for the high voltage analog circuitry.

Conventional automatic test equipment handles the multi-voltage level issue by often forming the digital circuitry on one chip, and the analog circuitry on a separate chip. While this has worked well in many instances, modern semiconductor devices are increasing in pin count, requiring additional channel resources from the tester to adequately test the devices. Having separate integrated circuits for channel resources running on different voltage levels undesirably leads to larger and/or higher numbers of channel cards. Larger testheads capable of receiving additional channel cards of increasing size are often required to meet the demands for more channels.

The size of a test system is very important to semiconductor manufacturers. Semiconductors are often tested in "clean rooms." A clean room has expensive filtering systems to keep dust and other impurities from corrupting the semiconductor devices, particularly before they are encased in a package. Each square foot of clean room space is very expensive to build and operate. It is thus highly desirable to limit the size of equipment that is placed in a clean room.

Cost is also an important issue for semiconductor device manufacturers. The cost of the silicon occupied by the circuitry inside an integrated circuit represents a small fraction of the overall cost of the device. Packaging the silicon, building a circuit board to hold the device, building a frame to hold the printed circuit boards all add substantial costs to the finished product. All of these costs increase with the number of integrated circuit chips.

Outside the field of automatic test equipment, it is known that CMOS circuits requiring different voltage levels may be employed on the same integrated circuit (chip) through stacking techniques. As shown in FIG. 2, this simple technique employs a "stacked" number of CMOS gates disposed in series between the source voltage VDD and ground to distribute the voltage difference, thereby minimizing breaches of the breakdown voltage for each transistor.

Although this technique works well for its intended applications, the stacked transistors are typically formed with a thicker oxide on the output gates. This increases the size of the transistor substantially to give it a higher breakdown voltage characteristic. As is well known in the art, larger transistors generally reflect reduced switching speeds. The higher breakdown voltage is often necessary because of the uneven division of the source voltage on the stacked transistors. This unevenness typically occurs because of the common transistor bulk connections at Bp and Bn (in phantom). For applications needing high performance switching speeds, the conventional stacking technique is often unacceptable.

What is needed and as yet unavailable is a channel architecture for automatic test equipment that enables the fabrication of circuits operating at different voltages on a single integrated circuit without performance penalties. The channel architecture described herein satisfies this need.

SUMMARY

The channel architecture described herein enables multi-voltage levels on the same integrated circuit without sacrificing performance. This provides the capability of minimizing the number and size of channel cards employed in automatic test equipment.

To realize the foregoing advantages, a channel architecture for use in automatic test equipment is described herein. The channel architecture comprises pattern generation circuitry and timing circuitry responsive to the pattern generation circuitry to generate timing signals. Formatting circuitry coupled to the output of the timing circuitry generates pulse waveforms for application to pin electronics circuitry. The pin electronics circuitry is responsive to the formatting circuitry for interfacing the automatic test equipment to a device-under-test. The pattern generation circuitry, the timing circuitry, the formatting circuitry and the pin electronics circuitry are formed on the same integrated circuit.

Additionally, automatic test equipment for testing semiconductor devices is described herein. The automatic test equipment comprises a controller and a testhead. The testhead is adapted for housing a plurality of channel cards, with each channel card comprising a plurality of integrated circuit chips. Each chip comprises pattern generation circuitry, timing circuitry responsive to the pattern generation circuitry to generate timing signals, formatting circuitry coupled to the output of the timing circuitry to generate pulse waveforms, and pin electronics circuitry responsive to the formatting circuitry for interfacing the automatic test equipment to a device-under-test.

Other features and advantages of the present invention will be apparent from the following detailed description when read in conjunction with the accompanying drawings.

BRIEF DESCRIPTION OF THE DRAWINGS

The duty cycle compensation circuit will be better understood by reference to the following more detailed description and accompanying drawings in which.

DETAILED DESCRIPTION

The channel architecture described herein provides a way to combine relatively high voltage and low voltage circuits on the same integrated circuit chip without incurring undesirable performance degradation. This is accomplished by forming the various circuits in accordance with silicon-on-insulator process technology.

Figure 3:
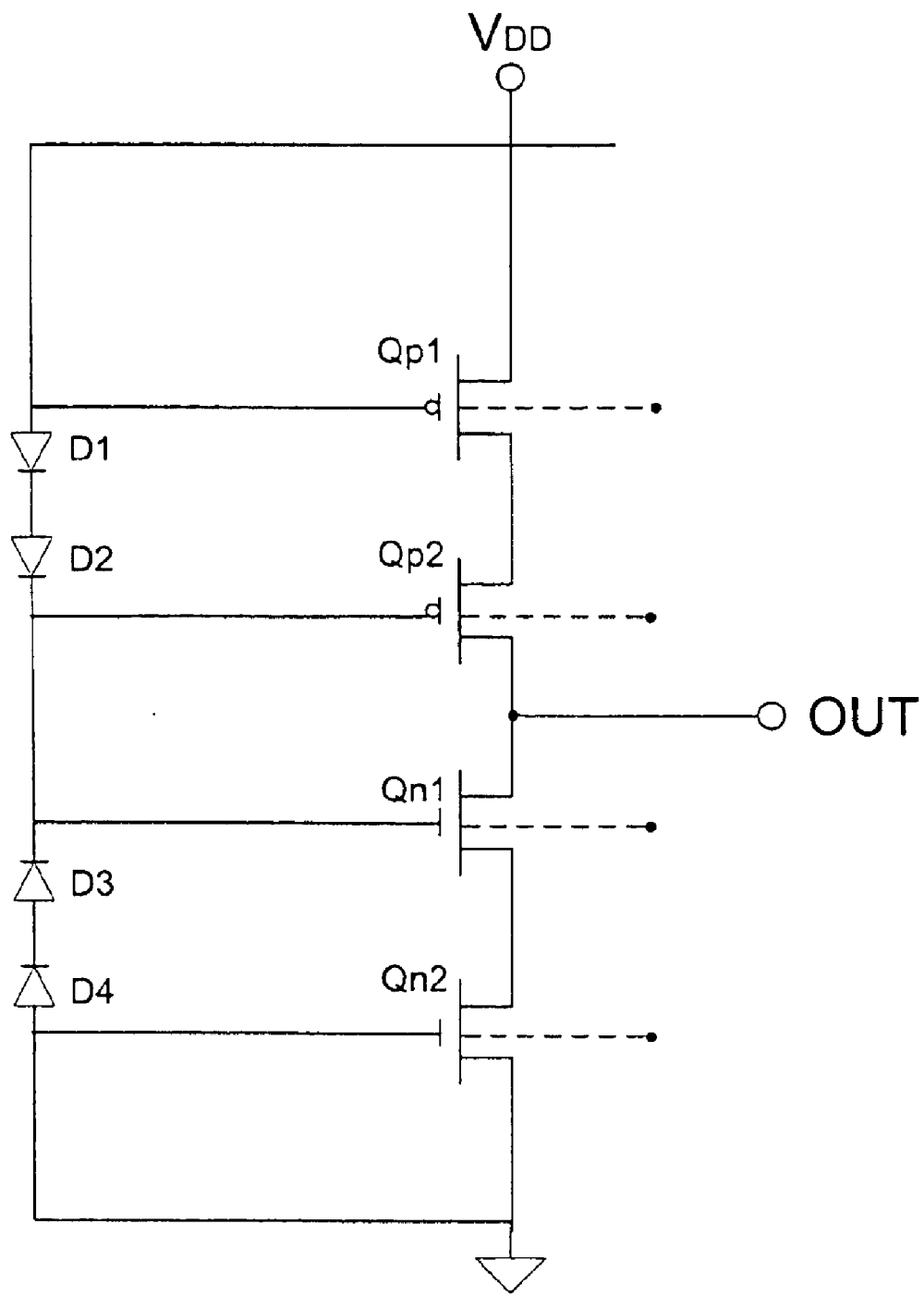
FIG. 3 is a schematic of a stacked CMOS inverter formed by a CMOS silicon-on-insulator process.

FIG. 3 illustrates a basic stacked CMOS inverter array suitable for use in the channel architecture described herein, and enabled by the use of a silicon-on-insulator (SOI) process. The inverter array includes a pair of p-channel transistors QP1 and QP2 disposed in series between a source voltage VDD and a pair of n-channel transistors QN1 and QN2. The node formed by the connection of the p-channel and n-channel transistors forms the inverter output OUT. An array of diodes D1–D4 coupled to the gates of the p-channel and n-channel transistors and the source voltage VCC provide voltage inputs of differing levels. The n-channel transistors are configured to complement the p-channel devices.

Figure 2:
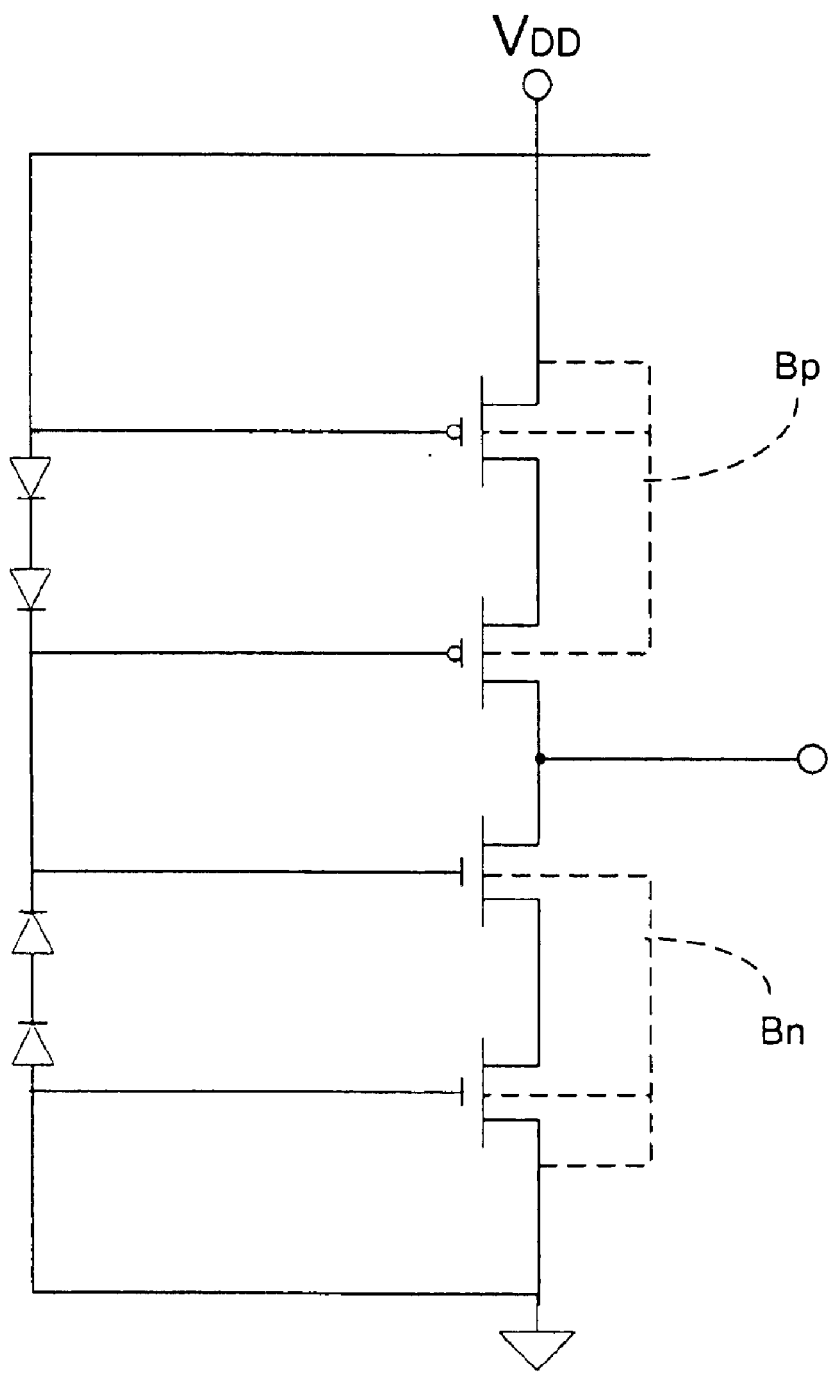
FIG. 2 is a schematic of a conventional stacked CMOS inverter.

At first glance, the stacked inverter array described above appears very similar to the conventional CMOS stacked inverter array illustrated in FIG. 2. However, as shown in FIG. 3, no common bulk connections exist for the transistors. In other words, the transistors are isolated from all the other devices. This isolation ensures that the voltage between the source voltage VDD and ground is divided equally between the stacked transistors. This, in turn, allows for the use of smaller transistors having lower breakdown voltages, and higher switching speeds.

Figure 4:
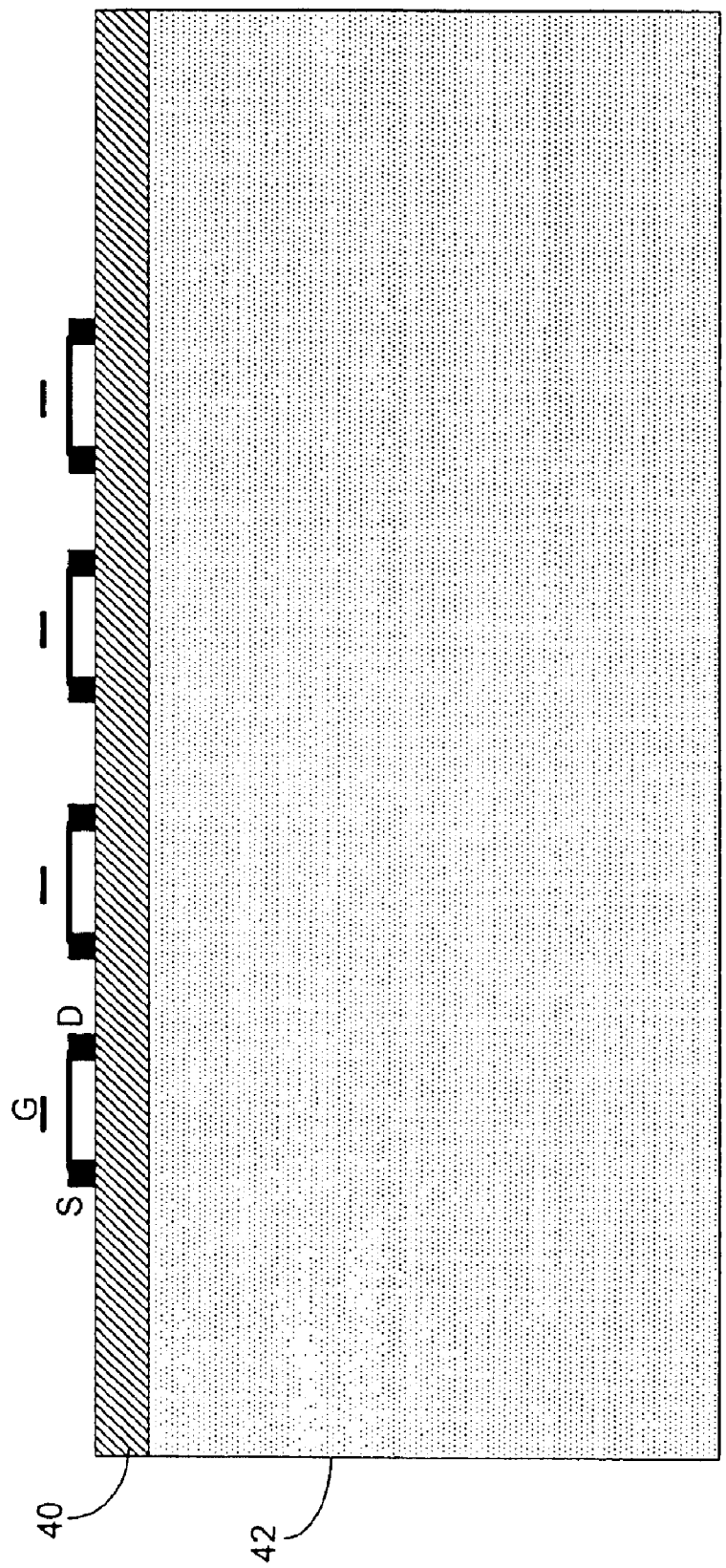
FIG. 4 is a partial cross-sectional view of an integrated circuit device formed by a silicon-on-insulator process.

FIG. 4 shows how the isolation of each transistor is achieved through the SOI process. Generally, a semiconductor layer including the source S, gate G and drain D terminals for each CMOS device are formed on top of a thin layer of SiO2 40. The layer of SiO2 isolates each device from the bulk wafer 42, and from the other transistors.

Detailed process steps for constructing the various SOI CMOS features (source, gate, drain, SiO2 layer, etc.) are well-known to those skilled in the art and warrant no further description herein.

With the SOI technology described above, the application of an SOI integrated circuit to the field of automatic test equipment (ATE) will now be described. It should be understood that the basic stacked inverter construction described above may be employed in various ways to deliver voltage inputs of varying levels to varying circuits on the integrated circuit.

Figure 5:
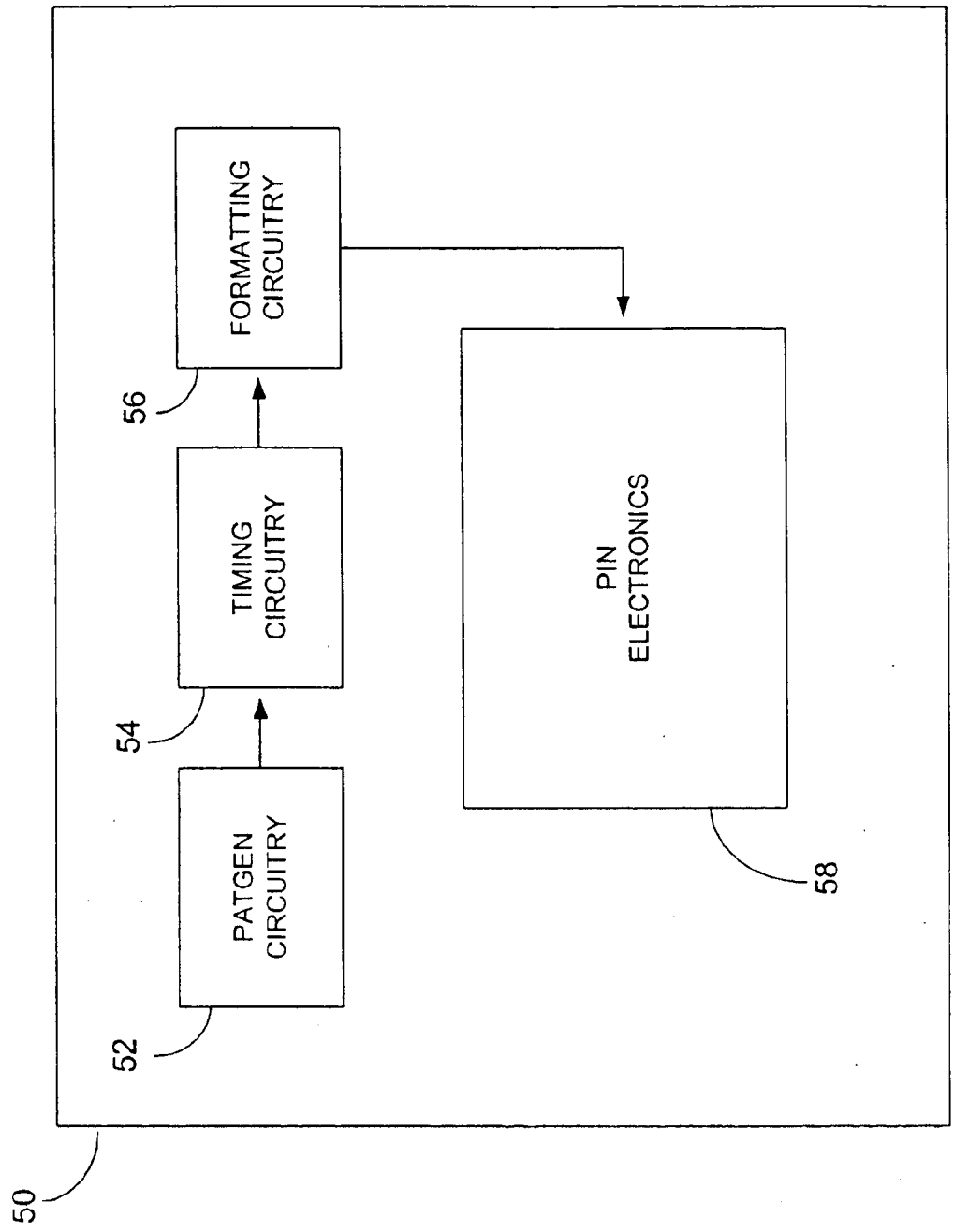
FIG. 5 is a block diagram view of an ATE channel formed on a single integrated circuit.

Referring now to FIG. 5, an ATE channel architecture for implementation on a single integrated circuit device or "chip" 50 is illustrated. The architecture employs a plurality of channels, each channel including pattern generation circuitry 52 feeding programmed timing information to a timing generation circuit 54. A formatter circuit 56 receives timing signals generated by the timing generation circuit and produces pulse waveforms having edges defined by the timing signals. The pattern generation circuitry, the timing circuitry and the formatting circuitry preferably take the form of low voltage digital circuits with input levels on the order of one volt.

Further referring to FIG. 5, the formatter circuit in one advantageous form includes a duty cycle compensation circuit (not shown), such as that disclosed in copending U.S. patent application Ser. No. 10/749,265, filed Dec. 31, 2003, titled "Duty Cycle Compensation Circuit", assigned to the assignee of the present invention, and incorporated herein by reference. The compensation circuit minimizes the effect of hysteresis-induced duty cycle error acting on the pulse waveforms.

Figure 1:
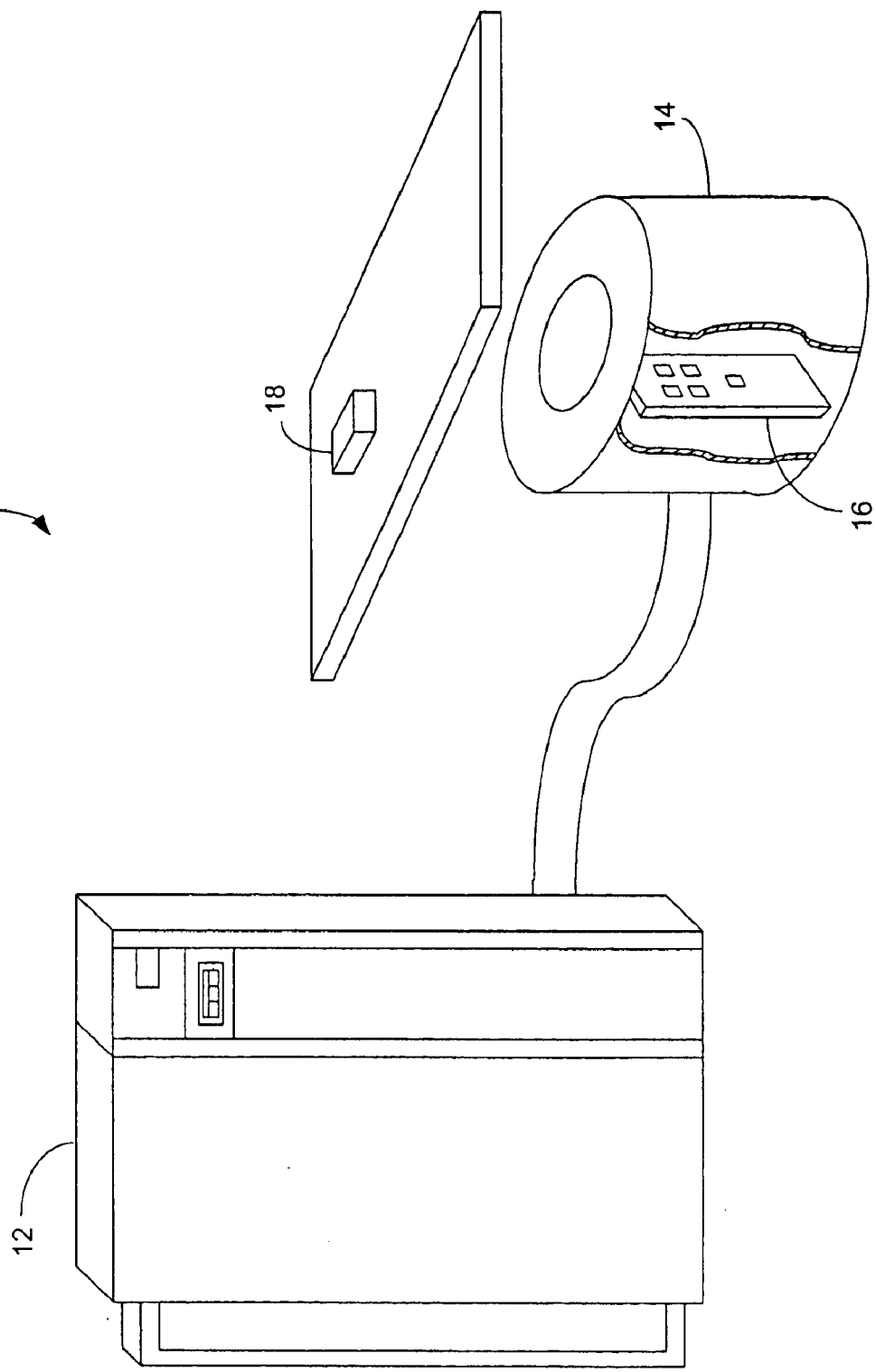
FIG. 1 is a perspective view of a semiconductor tester.

With continued reference to FIG. 5, the formatted waveforms from the formatter circuitry 56 are then fed to pin electronics circuitry 58 that further modifies the tester waveforms so that the tester successfully interfaces to the pins of the device-under-test 18 (DUT) (FIG. 1). Pin electronics are typically relatively high-voltage analog circuits with voltage levels on the order of around three volts. It is in this specific area that the use of the SOI process provides the maximum benefit by allowing the high-voltage pin electronics circuits to be formed on the same silicon chip containing the low-voltage ATE digital circuitry. Because of the individual transistor isolations, and the allowability of using stacked transistors with low breakdown voltages, the switching speeds for the pin electronics circuits are maximized.

Preferably, a ninety nanometer or finer SOI process is utilized that provides the analog and digital resources to form at least sixteen ATE channels on each chip 50 (FIG. 5). The chips are then arranged in arrays on specialized circuit boards to form the channel cards 16 (FIG. 1) for installation in the ATE testhead 14 (FIG. 1). By combining the high voltage and low voltage ATE channel electronics onto the same piece of silicon, dramatic reductions in channel card footprints are realizable. This, in turn, allows for the reduction in the testhead size for more available space in the semiconductor manufacturers cleanroom.

Those skilled in the art will recognize the many benefits and advantages afforded by the present invention. Of significant importance is the implementation of SOI technology in the field of ATE. This enables the use of high voltage and low voltage transistors on the same integrated circuit device without any performance penalties. By combining the resources for an entire ATE channel on a single device, substantial cost advantages may be realized for the semiconductor device manufacturer.

While the invention has been particularly shown and described with reference to the preferred embodiments thereof, it will be understood by those skilled in the art that various changes in form and detail may be made therein without departing from the spirit and scope of the invention. For instance, while the preferred process technology identified herein is SOI CMOS, it should be understood that other process technologies that provide individual device isolation would also be suitable for the ATE channel architecture described herein.

What is claimed is:

1. A channel architecture for use in automatic test equipment, the channel architecture comprising:
    pattern generation circuitry;
    timing circuitry responsive to the pattern generation circuitry to generate timing signals;
    formatting circuitry coupled to the output of the timing circuitry to generate pulse waveforms; and
    pin electronics circuitry responsive to the formatting circuitry for interlacing the automatic test equipment to a device-under-test, wherein the pattern generation circuitry, the timing circuitry, the formatting circuitry and the pin electronics circuitry are formed on the same integrated circuit.

2. A channel architecture according to claim 1 wherein the integrated circuit is formed by a silicon-on-insulator process.

3. A channel architecture according to claim 1 wherein the pattern generation circuitry, the timing circuitry and the formatting circuitry comprise low voltage digital circuits operating at voltage levels no greater than one volt.

4. A channel architecture according to claim 1 wherein the pin electronics circuitry comprises high-voltage analog circuits operating at voltages higher than one volt.

5. Automatic test equipment for testing semiconductor devices, the automatic test equipment comprising:
    a controller; and
    a testhead, the testhead adapted for housing a plurality of channel cards, each channel card comprising a plurality of integrated circuit chips, each chip comprising
        pattern generation circuitry,
        timing circuitry responsive to the pattern generation circuitry to generate timing signals;
        formatting circuitry coupled to the output of the timing circuitry to generate pulse waveforms, and
        pin electronics circuitry responsive to the formatting circuitry for interfacing the automatic test equipment to a device-under-test.

6. Automatic test equipment according to claim 5 wherein the integrated circuit is formed by a silicon-on-insulator process.

7. Automatic test equipment according to claim 5 wherein the pattern generation circuitry, the timing circuitry and the formatting circuitry comprise low voltage digital circuits operating at voltage levels no greater than one volt.

8. Automatic test equipment according to claim 5 wherein the pin electronics circuitry comprises high-voltage analog circuits operating at voltages higher than one volt.

* * * * *